(12) United States Patent
Goerlach

(10) Patent No.: US 7,154,129 B2
(45) Date of Patent: Dec. 26, 2006

(54) SEMICONDUCTOR ARRANGEMENT WITH A P-N TRANSITION AND METHOD FOR THE PRODUCTION OF A SEMICONDUCTOR ARRANGEMENT

(75) Inventor: Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/467,094

(22) PCT Filed: Nov. 27, 2002

(86) PCT No.: PCT/DE02/04358

§ 371 (c)(1),
(2), (4) Date: Dec. 23, 2003

(87) PCT Pub. No.: WO03/049198

PCT Pub. Date: Jun. 12, 2003

(65) Prior Publication Data

US 2004/0099929 A1 May 27, 2004

(30) Foreign Application Priority Data

Dec. 4, 2001 (DE) ................. 101 59 498

(51) Int. Cl.
*H01L 29/74* (2006.01)
(52) U.S. Cl. ................. 257/129; 257/171
(58) Field of Classification Search ......... 438/133, 438/420, 545, 546, 558, 561, 920, 974; 257/129, 257/171

See application file for complete search history.

(56) References Cited

U.S. PATENT DOCUMENTS

| | | | | |
|---|---|---|---|---|
| 3,341,380 A | | 9/1967 | Mets et al. | |
| 3,909,119 A | * | 9/1975 | Wolley | 257/487 |
| 3,933,541 A | * | 1/1976 | Hagino et al. | 438/133 |
| 4,040,878 A | * | 8/1977 | Rowe | 438/460 |
| 4,683,483 A | * | 7/1987 | Burnham et al. | 257/551 |
| 4,720,469 A | * | 1/1988 | Keser et al. | 438/558 |
| 5,150,176 A | * | 9/1992 | Schoenberg | 257/496 |
| 5,432,360 A | | 7/1995 | Kim et al. | |
| 5,541,140 A | * | 7/1996 | Goebel et al. | 438/380 |

FOREIGN PATENT DOCUMENTS

| | | |
|---|---|---|
| DE | 1248165 | 8/1967 |
| DE | 43 20 780 | 3/1995 |
| WO | 93 08592 | 4/1993 |
| WO | 01 75966 | 10/2001 |

\* cited by examiner

*Primary Examiner*—Thomas L. Dickey
(74) *Attorney, Agent, or Firm*—Kenyon & Kenyon LLP

(57) ABSTRACT

A semiconductor system (200), particularly a diode, having a p-n junction is proposed, that is formed as a chip having an edge area, which includes a first layer (2) of a first conductivity type and a second layer (1, 3) of a second conductivity type; the second layer (1, 3) including at least two sublayers (1, 3); both sublayers (1, 3) forming a p-n junction with the first layer (2); the p-n junction of the first layer (2) with the first sublayer (3) being provided exclusively in the interior of the chip, and the p-n junction between the first layer (2) and the second sublayer (1) being provided in the edge area of the chip; for each cross-section of the chip area parallel to the chip plane, the first sublayer (3) corresponding only to a part of such a cross-section.

5 Claims, 5 Drawing Sheets

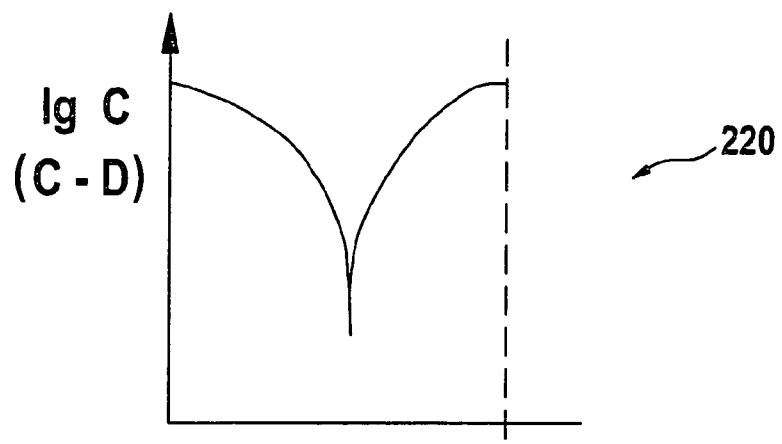
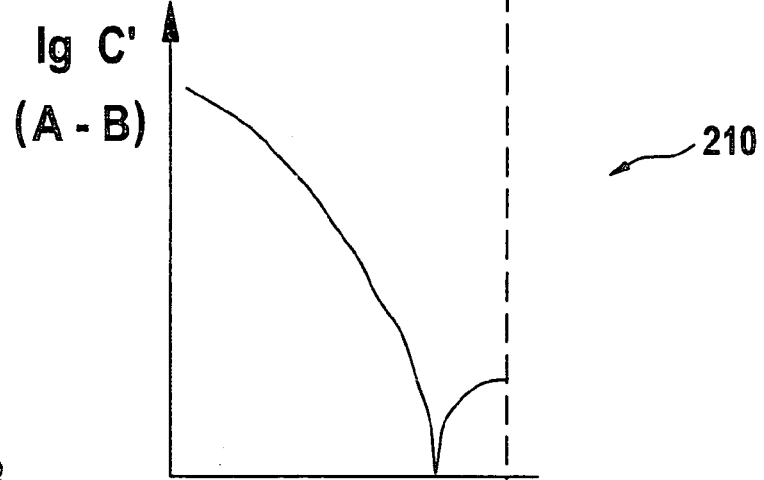
Fig. 3
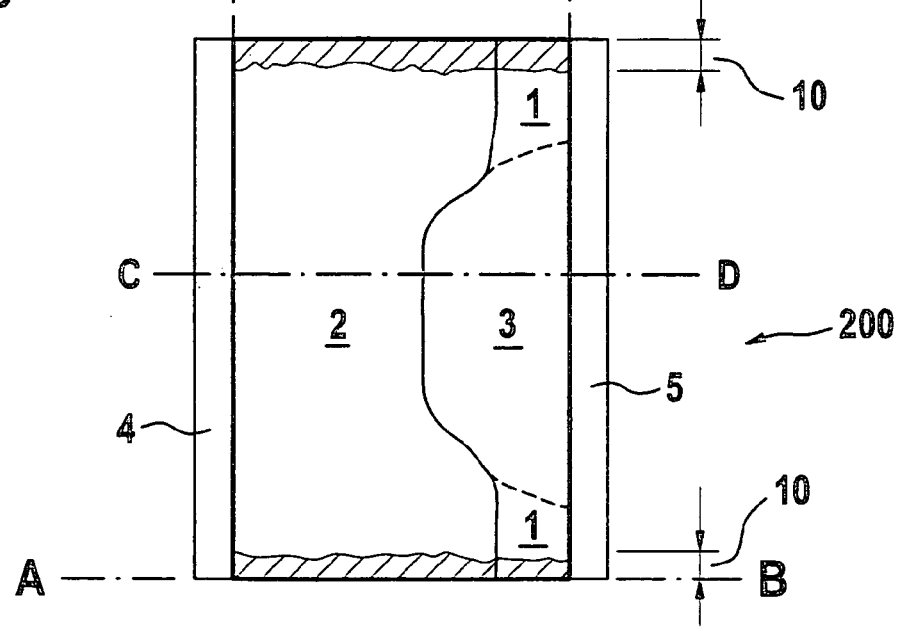

SEMICONDUCTOR ARRANGEMENT WITH A P-N TRANSITION AND METHOD FOR THE PRODUCTION OF A SEMICONDUCTOR ARRANGEMENT

FIELD OF THE INVENTION

The present invention is directed to a semiconductor system and to a method.

BACKGROUND INFORMATION

German Patent No. 43 20 780 describes a semiconductor diode, in which the field intensity occurring in the edge area of the semiconductor chip is less than the field intensity in the interior of the component.

SUMMARY OF THE INVENTION

In contrast, the semiconductor system of the present invention and the method of the present invention having the features of the coordinated independent claims have the advantage that the field intensity in the edge area is even further reduced. Moreover, the ratio of the field intensity in the middle of the component to the field intensity in the edge area of the component is no longer dependent on the selected breakdown voltage, the so-called Zener voltage. This in turn has the advantage that even smaller reverse currents may be attained for diodes with unetched edges. The pulse strength, and therefore the reliability is also further improved. Moreover, it is also advantageously possible to realize diodes with higher breakdown voltages using the system of the present invention.

BRIEF DESCRIPTION OF THE DRAWINGS

FIG. 3 shows a schematic representation of the cross-section and doping profile of a first specific embodiment of the semiconductor system according to the present invention with reduced marginal field intensity.

DETAILED DESCRIPTION

Figure 1:
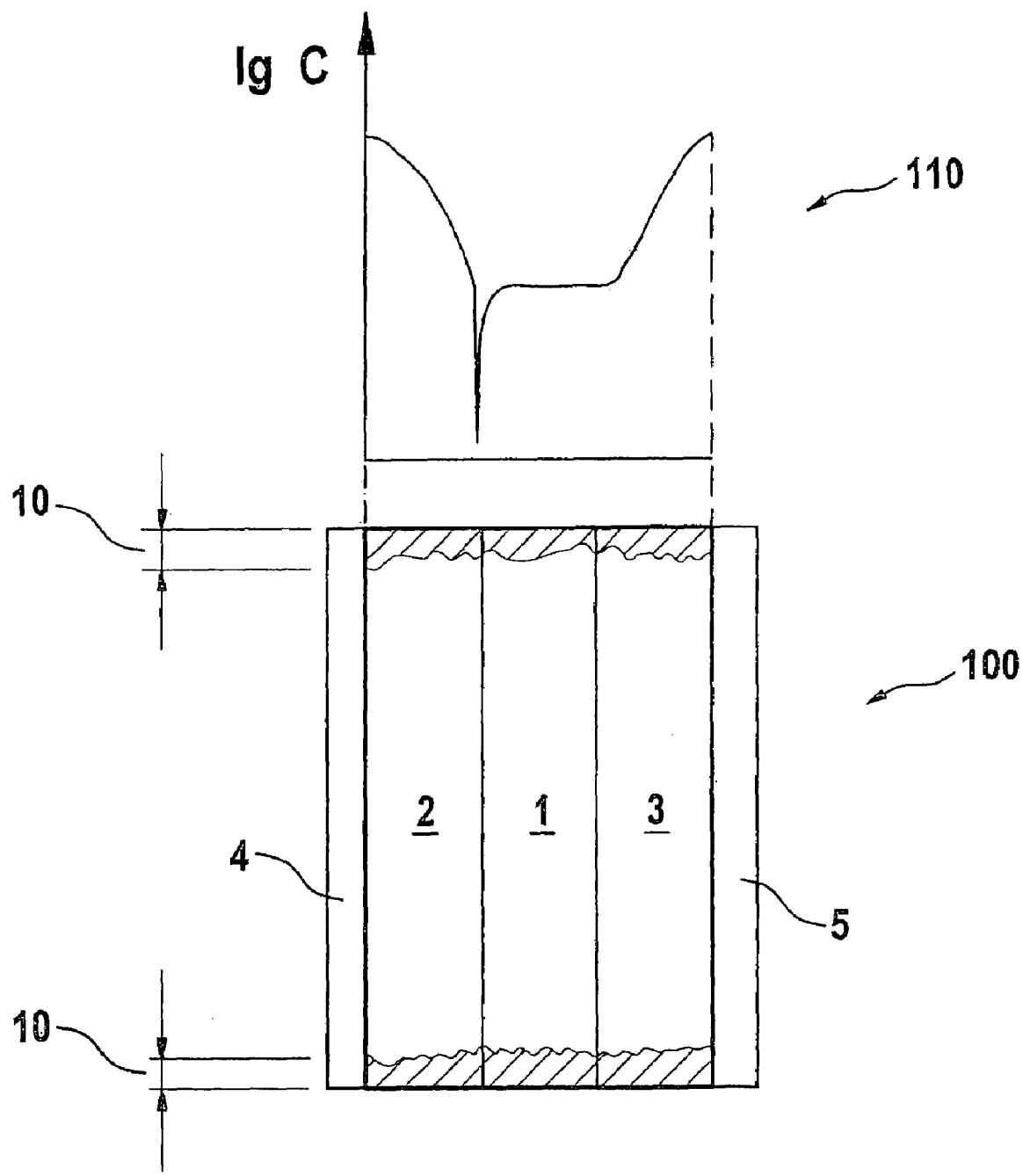
FIG. 1 shows a schematic representation of the cross-section and doping profile of a known diode.

FIG. 1 shows a known diode 100 in its cross-section and its doping profile. Semiconductor diodes 100 for voltage limitation are as a rule designed as p-n diodes, so that a p-doped layer 2, also designated in the following as first layer 2, is diffused into a homogeneously n-doped region 1. To reduce the bulk resistance and for better ohmic binding of the n-type semiconductor to the metallization, n-doped region 1 is strongly n-doped from the back side of the wafer, which in all figures, is to be thought of on the right side of the figure. A region 3 designated by reference numeral 3 is thereby formed. N-doped region 1 and more strongly n-doped region 3 are also designated jointly in the following as second layer, more strongly n-doped region 3 also being designated as first sublayer 3 of the second layer, and n-doped region 1 also being designated as second sublayer 1 of the second layer. The reference to n-type doping and p-type doping, respectively, for certain layers or regions is to be understood in FIG. 1 and in all further figures merely by way of example; according to the present invention, the type of charge carrier used for the doping may also be interchanged.

Diode 100 is shown in the lower part of FIG. 1, and in the upper part of FIG. 1, a doping profile 110 of diode 100 is shown along a line extending in a direction perpendicular to the substrate plane of the semiconductor chip; as in all further figures, the upper side of the semiconductor chip is shown on the left side of FIG. 1, and the semiconductor chip, not provided with a reference numeral, is formed by first and second layers 1, 2, 3. An upper-side metallization 4 and a lower-side metallization 5 are also shown in FIG. 1.

If a reverse voltage $U_S$ is applied to such a diode 100, the current increases sharply as soon as Zener voltage $U_z$ is exceeded. The cause of the current rise, i.e. of the voltage limitation, lies in the commencing avalanche effect. Upon applying a reverse voltage $U_S$, a so-called space charge region develops at the p-n interface, i.e. at the p-n junction. As of a certain electrical field intensity $E_{crit}$ of approximately $(2-4)*10^5$ V/cm, charge carriers in the space charge region are accelerated so strongly that, in response to impacts with the crystal lattice, they break up bonds of the semiconductor and thus produce further electrons and holes which, on their part, are accelerated and are able to break up bonds. In this manner, the current increases beyond all measure, that is to say, it can become very great. In the case of known diode 100 according to FIG. 1, the p-n junction ends in the region of a sawing trench in the chip. Namely, to produce diodes 100, a plurality of diode chips are produced and processed jointly as a so-called wafer. This plurality of chips must subsequently be diced up. This is accomplished, for example, by sawing. The sawing trenches are thereby formed, which, however, are not designated independently in FIG. 1 with a reference numeral, but rather are merely recognizable as the edge of the chip. Depending upon the type of saw and the sawing process, the crystal lattice is disturbed in the region of the sawing trenches up to a depth, i.e. in a direction parallel to the chip plane, of several to several tens of micrometers. Such regions, also designated in the following as damage zone, have high densities of states in the band gap. The recombination possibility for charge carriers, and therefore the reverse current thereby increases. The electric field intensity necessary to trigger the avalanche effect is substantially less in the region of the damage zone than in the inner, undisturbed chip region. That is why the avalanche breakdown takes place first at the edge of the chip. Resulting from this are pre-breakdowns which express themselves in rounded blocking-state voltage-current characteristics. Since the current density is therefore increased in these edge areas, p-n diode 100 is more strongly loaded thermally at the chip edge than in the middle. This results in a markedly reduced pulse strength of the diode. Therefore, when working with such diodes 100, it is customary to ablate the disturbed chip region, i.e. the damage zone, for example, by etching with KOH. The width of the damage zone is designated in FIG. 1 and in all further figures by reference numeral 10.

Figure 2:
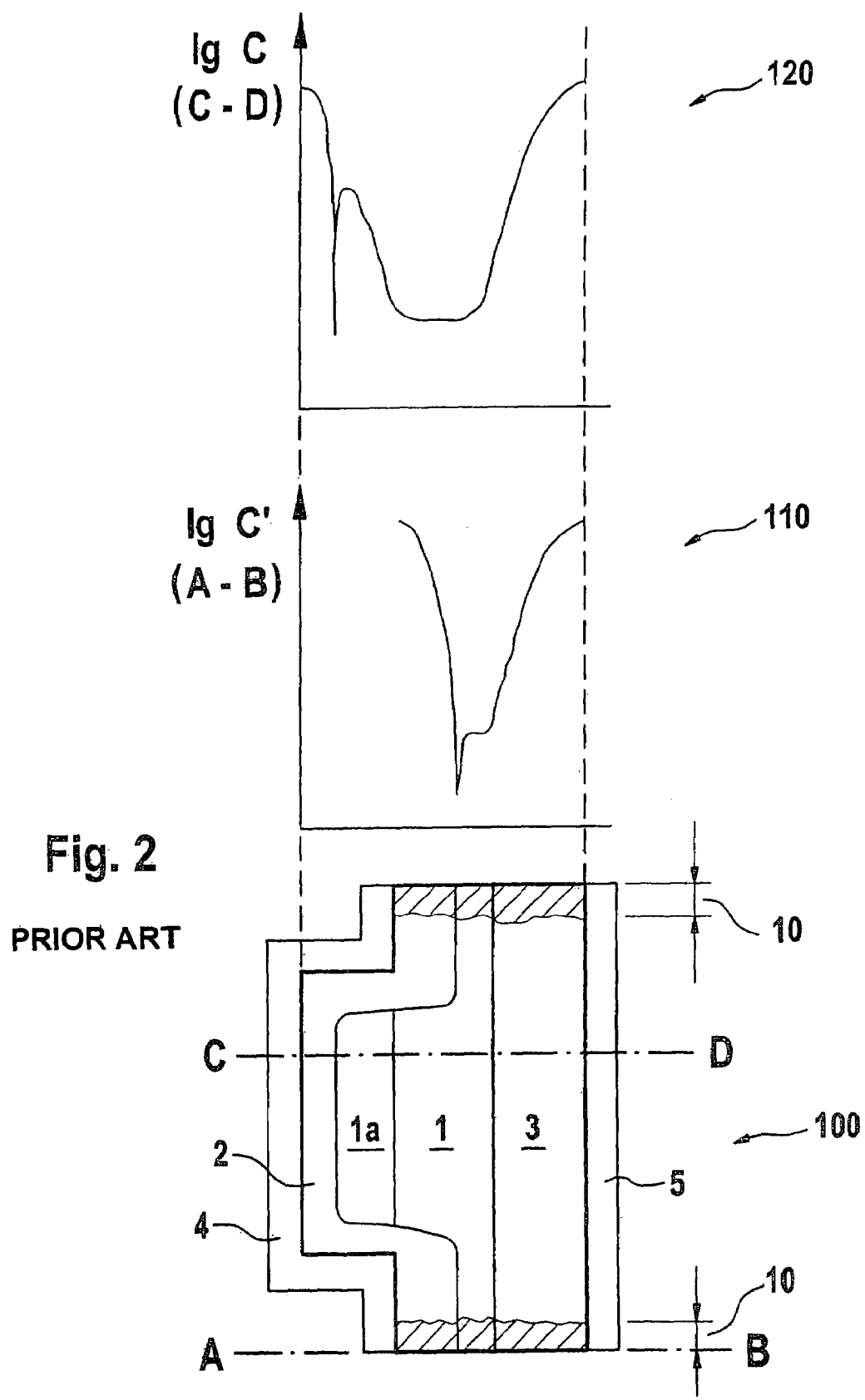
FIG. 2 shows a schematic representation of the cross-section and doping profile of a known diode with reduced marginal field intensity.

Diode 100 disclosed in printed matter DE 4320780 is shown in FIG. 2. Here, it is possible to dispense with the etching of the chip edges. Because of the suitable development of the diffusion profiles, the field intensity at the chip edge is less than the field intensity in the interior of the component. In the middle of the chip, a weakly n-doped layer 1a is additionally introduced between p-doped layer 2 and n-doped layer 1. Thus, it is possible, for example, to achieve a field intensity $E_R$ at the edge of the chip which is less by the factor 2.5 than field intensity $E_M$ in the interior of the diode chip. Since the reverse current of an unetched chip, i.e. of a chip whose damage zone is not removed, is dependent on the field intensity, the reverse currents in a system according to FIG. 2 are less in the edge area than in a chip according to FIG. 1. A doping profile 110 at the edge of diode 100—i.e. along line of intersection A-B from the lower part of FIG. 1—is shown in the middle part of FIG. 2, and a doping profile 120 in the middle of diode 100—i.e. along line of intersection C-D from the lower part of FIG. 1—is shown in the upper part of FIG. 2. Plotted in each case—as in all doping profiles shown in the further figures—is the absolute value of the concentration of the dopants in relative units on an indicated logarithmic scale. In the left part of the doping profiles—up to the absolute minimum of the concentration which marks the change in the type of charge carrier—the concentration of the first type of charge carrier in first layer 2 of the semiconductor system is shown, and correspondingly, the concentration of the second type of charge carrier in the second layer of the semiconductor system is shown in the right part of the doping profiles.

Since for diode 100 of FIG. 2, the breakdown does not take place at the mechanically and chemically sensitive chip edge, the pulse strength and the reliability of the diode increases. The system according to FIG. 2 has the disadvantage that the electrical resistance of the diode in the case of the avalanche breakdown is higher than in a system according to FIG. 1, since the dopant concentration in the interior of the chip is very low. This disadvantage becomes even greater if diodes according to FIG. 2 are to be rated for higher breakdown voltages $U_Z$ than, for example, $U_Z$=25 V. The reverse current also may not be reduced arbitrarily, since the relationship of field intensities $E_R$ to $E_M$ is strongly dependent on selected breakdown voltage $U_Z$. If $U_Z$ is selected to be higher, the reverse current increases.

The present invention puts forward a simple-to-produce diode 200 having reduced marginal field intensity, which eliminates the indicated disadvantages. Such a diode 200, i.e. such a semiconductor system 200, is shown in FIG. 3 and in the following FIGS. 4 and 5, further specific embodiments of diode 200 from FIG. 3 being depicted in FIGS. 4 and 5. For such a diode 200, the marginal field intensity is even further reduced compared to diode 100 shown in FIG. 2. In addition, the relationship of field intensities $E_R$ to $E_M$ is no longer dependent on selected breakdown voltage $U_Z$. Therefore, even smaller reverse currents may be attained for diodes with unetched edges. The pulse strength, and therefore the reliability are further improved. At the same time, the resistance in the avalanche case, i.e. in breakdown operation of the system, is dramatically reduced. Therefore, according to the present invention, it is also possible to realize diodes having higher breakdown voltages.

FIG. 3 shows a schematic representation of the cross-section of a first specific embodiment of a system 200 according to the present invention. First layer 2 is diffused over the entire surface into a weakly n-doped semiconductor substrate from the top side (the left in FIG. 3), and from the other side—in contrast to diode 100 in FIG. 2—a patterned, n-doped first sublayer 3 is diffused into the weakly n-doped semiconductor substrate. The upper and lower sides of the chip, i.e. of the semiconductor, are provided in known manner with thin metallic layers 4 and 5. This unpatterned metallization produces the ohmic contact to the semiconductor. For example, it may be made of the layer sequence chromium, nickel, and silver. FIG. 3 also shows the profile of dopant concentrations 210—along the chip edge; compare line of intersection A-B from the lower part of FIG. 3—and 220—along the middle of the chip; compare line of intersection C-D from the lower part of FIG. 3. The n-type doping at the edge—compared to the n-type doping in the middle—leads to a higher breakdown voltage $U_Z$ at the edge than in the middle region. If a reverse voltage is applied to diode 200, then up to breakdown voltage $U_Z$, only the relatively small reverse current flows which stems essentially from the damage zone. If breakdown field intensity $E_{crit}$ is reached in the inner region, the field intensity at edge $E_R$ is still very small, since in system 200 of the present invention, the ratio of electrical field intensity $E_R$ at the edge to field intensity $E_M$ in the middle is large. In turn, this results in small reverse currents. Since the dopant concentration in the middle region is substantially greater than for a conventional system, the resistance of the diode is also very small both during operation in the conducting state and in the breakdown state. This system is thereby particularly suitable for higher Z-voltages $U_Z$.

Figure 4:
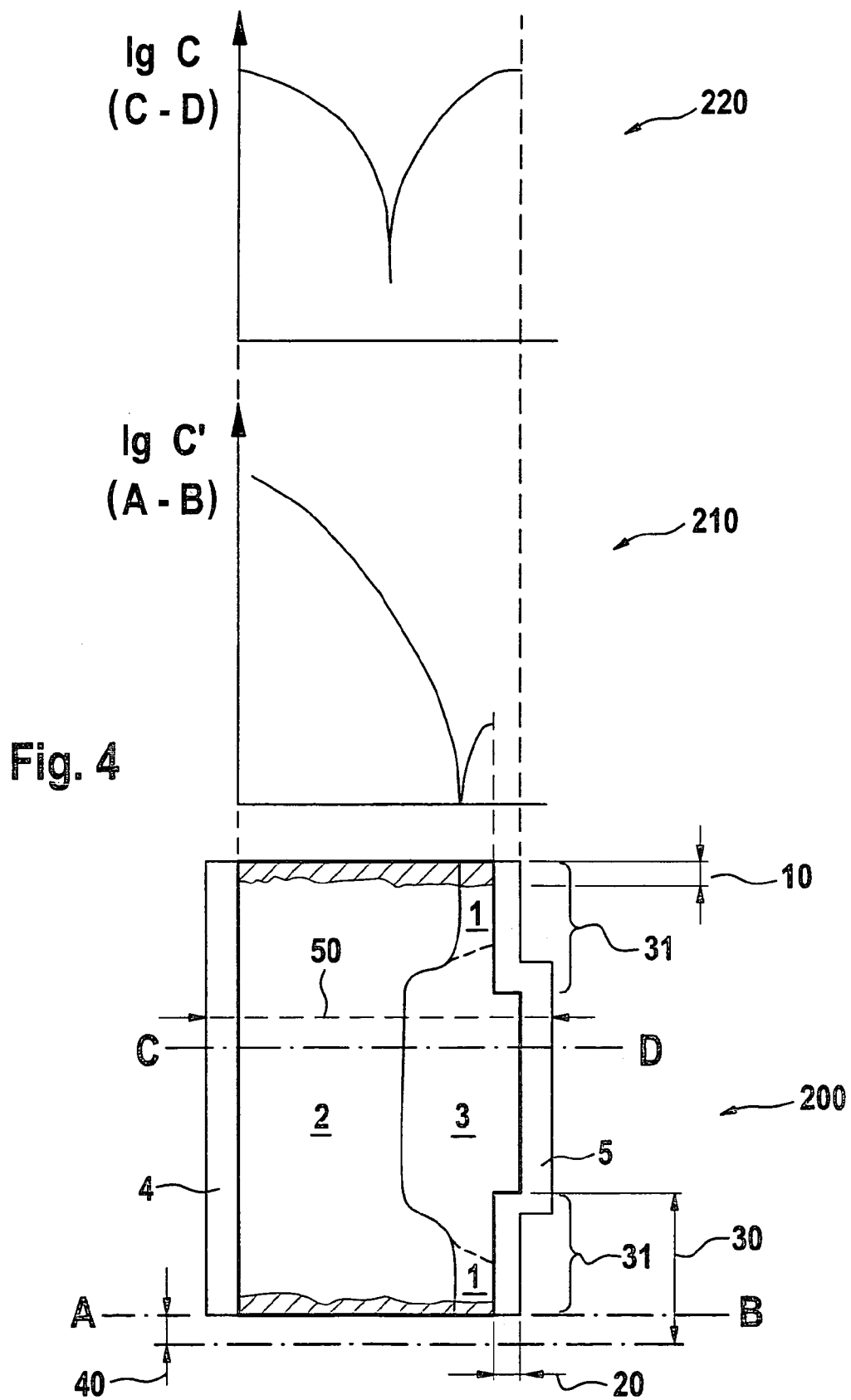
FIG. 4 shows a schematic representation of the cross-section and doping profile of a second specific embodiment of the semiconductor system according to the present invention with reduced marginal field intensity, in which the patterning is effected by a sawing-in procedure.

An advantageous manufacturing process of the present invention for a semiconductor system 200 of the present invention is described in FIG. 4 in terms of a second specific embodiment. By way of example, diode 200 is rated for a Zener voltage of approximately 50 V; however, according to the present invention, higher or lower Zener voltages are also possible.

A substrate, made in particular of silicon, having a thickness of, for example, 180 μm, which is provided in FIG. 4 with reference numeral 50, and having an n-type basic doping of 3.54 *$10^{14}$ cm$^{-3}$, is coated, i.e. is doped, on the front side with boron and on the back side with phosphorus. Instead of silicon, according to the present invention, another semiconductor material may also be used. The invention is described in the following in terms of a silicon substrate. The basic doping of the substrate corresponds to the doping of second sublayer 1 of the second layer, and is also designated in the following as second dopant concentration. According to the present invention, thickness 50 of the substrate, which corresponds to the thickness of the chip, should be kept as precise as possible and have small tolerances. The coating may be accomplished in various ways, for example, by ion implantation, by vapor-phase coating, by doping glasses, by doping pastes or by doping foils. In particular, in the present invention, doped glass layers may be applied by APCVD (atmospheric pressure chemical vapor deposition) methods. Using these methods, boron may advantageously be applied on the front side and phosphorus may be applied on the back side, virtually simultaneously. A diffusion process lasting approximately 0.5 to 3 hours is subsequently carried out at high temperatures, e.g. at 1265° C., in oxygen-containing atmosphere. After that, for example, a boron dose or phosphorus dose of $(1-2)*10^{17}$ cm$^{-2}$ is located in the silicon wafer. This boron dose or phosphorus dose is concentrated in a comparatively thin layer, which is also designated in the following as "pre-doping layer" or as pre-coating layer. The n-doped wafer back side, coated with phosphorus, is subsequently patterned. This may advantageously be carried out by sawing into the back side using a diamond saw, or by water-supported laser cutting. The sawing depth, which is designated in FIG. 4 by reference numeral 20, may, for example, be approximately 10–30 μm. As a rule, the sawing depth is selected so that it is deeper than the penetration depth of the phosphorus layer at this point of time, i.e. the pre-doping layer. Because of this, in the regions where the phosphorus dose is removed by sawing, the basic doping of the silicon substrate is again present. Instead of the sawing, the present invention also provides for patterning the back side of the wafer by etching. By removing a part of the chip back side, e.g. by sawing, the chip thickness on a partial surface 31 of the back side of the wafer is reduced. On the back side of the wafer which does not belong to partial surface 31, a type of pedestal is thereby formed in which the phosphorus dose is located. Partial surface 31 therefore becomes a trench compared to the "pedestal". According to the present invention, the width of the saw cut, whose half is designated in FIG. 4 by reference numeral 30, is indicated by way of example at 300 μm. In general, it holds that the sawing width, i.e. its half 30, is selected so that at the end of the subsequent diffusion process described below, remaining on the wafer back side at the chip edge is a region which corresponds to second sublayer 1, thus where the basic doping of the substrate has remained unchanged. After the patterning process, the actual diffusion, the driving of the dopants "stored" in the pre-doping layer into the semiconductor material, i.e. particularly into the silicon, takes place. This procedure is also denoted as indiffusion. In so doing, second sublayer 1 is not reached by the "stored" phosphorus dose. While carrying out the diffusion, the phosphorus dose located in the pedestal also travels into the region of the trench, i.e. partial surface 31, without, however, penetrating it completely. It thereby holds true that there is no cross-section of the chip area parallel to the chip plane, for which first sublayer 3 takes up the entire cross-section of the chip.

Conversely, this means that for each cross-section of the chip area parallel to the chip plane, first sublayer 3 corresponds only to a part of such a cross-section. According to the present invention, the patterned "storage" of the dopants for doping the back side of the chip may of course also be provided in such a way that the doping is carried out in a patterned fashion, such that the storage of dopants is implemented in a patterned manner, that is to say, doping is not carried out on the entire back side of the chip, but rather location-selectively only in the center region of a chip, for example, by conventional photo techniques.

The diffusion is carried out, for example, at 1265° C. during 142 hours. According to the present invention, different diffusion temperatures and diffusion times, as well as different "stored" doses of dopants may, of course, also be selected. After the diffusion process, a diffusion profile or a doping profile is obtained as is designated in FIG. 4 by reference numerals 210 and 220, respectively. The diffusion profile in the actual useful area of the chip, i.e. in the chip center, that is, section C-D, is represented by the concentration profile designated by reference numeral 220. The concentration of n-type doping is greater by several orders of magnitude than at the chip edge; compare the doping profile, provided with reference numeral 210, along intersection A-B.

After the diffusion process, the wafer, having the chips thus treated, is provided in a known manner on its front side and back side with metallic layers 4, 5 for the contacting. Thus, the present invention provides, for example, for the use of a chromium/nickel/silver metallization. After the metallization process, the wafers bearing the individual diode chips are cut through, for example by sawing using, for instance, a diamond saw having a saw blade width of, for example, 40 μm, so that the chips are separated, and the saw-through cut is located precisely in the middle of the wide sawing trench, already created, for patterning the back side of the wafer. In this context, it is advantageous to saw through the wafer from the back side—represented in the figure on the right side—in order to obtain an easy alignment. The half of the saw blade width is designated in FIG. 4 by reference numeral 40. Alternatively, it is also provided in the present invention to separate the chips by water-supported laser cutting or by a chemical method.

In the present invention, the chips are packaged in a known manner in a housing, such as in a diode press-fit housing.

According to the present invention, particularly to reduce the reverse current even further, it is also possible to remove the damage zone at the chip edge. Methods using wet chemicals (etching, for instance, with KOH), vapor-phase etching or the like present themselves for this purpose. In general, however, this is dispensed with in the present invention. In addition, the reverse currents may be diminished by a temperature treatment of the sawed-through diode chips at 350° C.–500° C. under inert-gas atmosphere or reductive atmosphere.

If, in the example shown, reverse voltage Us at the diode now reaches the value of $U_Z$=50 V, then the avalanche breakdown occurs at the p-n junction between first layer 2 and first sublayer 3. Field intensity $E_M$ at this interface has reached value $E_{crit}$. Since the "edge diode", i.e. the p-n junction, present in the edge area of the chip, between first layer 2 and second sublayer 1, would first break down, for example, at 640 V, field intensity $E_R$ at the edge is very low in this operating state. For example, it amounts to only a sixth of the value in the center of the chip. Therefore, markedly smaller reverse currents occur than in a system according to FIG. 2. In addition, this relationship may be adjusted within wide ranges by varying the basic doping, which is still present in second sublayer 1, since breakdown voltage $U_Z$ in the chip center is virtually independent of the basic doping. In contrast to substrate thickness 50, which should have the smallest possible fluctuations, fluctuations in the basic doping, i.e. in the second dopant concentration, in second sublayer 1 is not critical. In addition to the small reverse current, a system 200 shown in FIG. 4 exhibits very small bulk resistance and breakdown resistance, since the n-type doping in the useful area, i.e. in the area of section C-D, is higher by several orders of magnitude than in the edge area.

Figure 5:
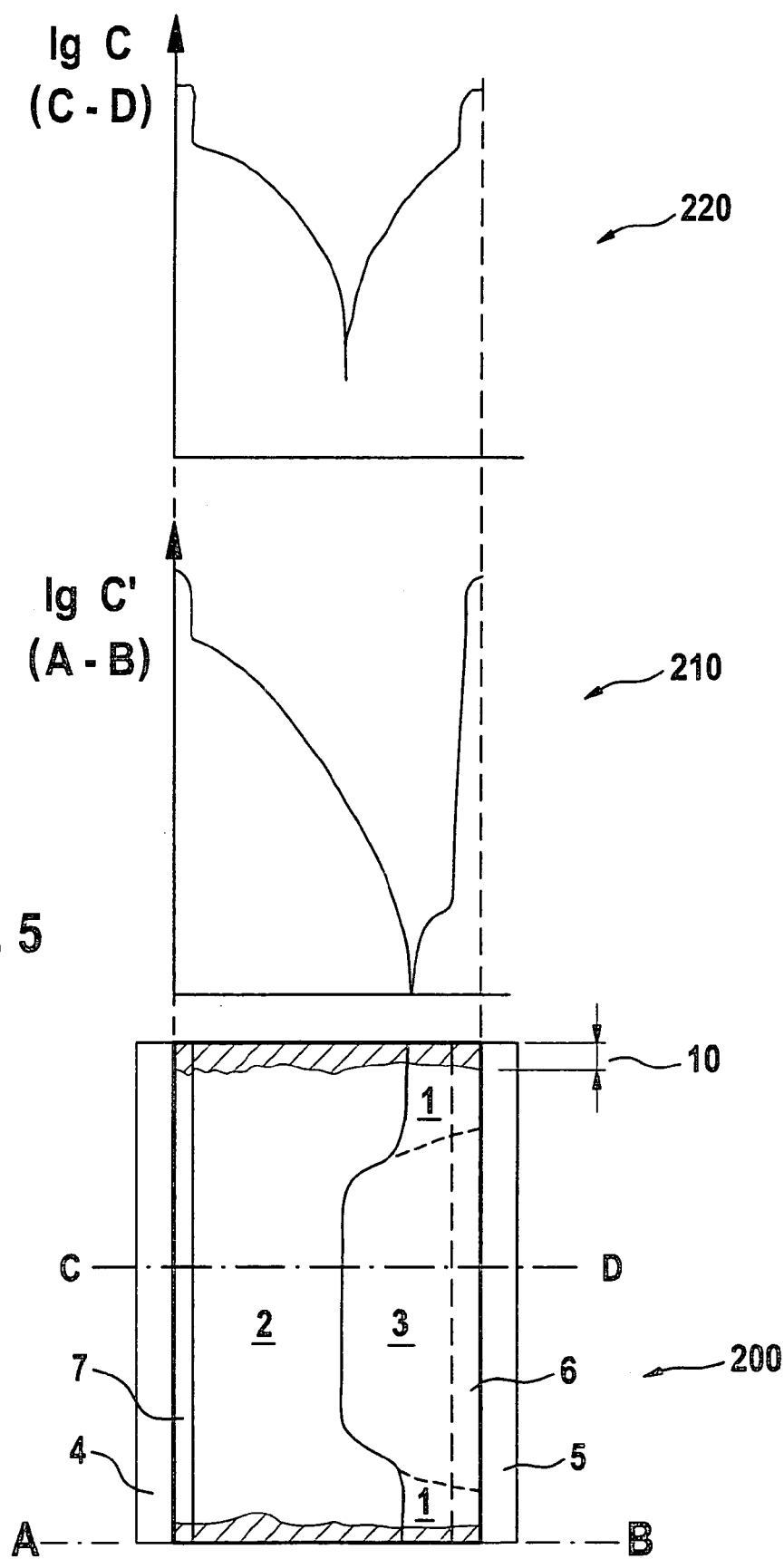
FIG. 5 shows a schematic representation of the cross-section and doping profile of a third specific embodiment of the semiconductor system according to the present invention with reduced marginal field intensity, having additional doping on the chip surfaces.

FIG. 5 shows a third exemplary embodiment of system 200 according to the present invention, all identical reference numerals from the preceding figures indicating the equivalent. In the system according to FIG. 5, the region of first layer 2 near to the surface is provided with a flat, strongly p-doped third layer designated by reference numeral 7. In system 200 according to FIG. 5, the regions of first sublayer 3 and of second sublayer 1 near to the surface are likewise provided with a flat, however strongly n-doped fourth layer having reference numeral 6. According to the present invention, third and fourth layers 6, 7 may again advantageously be implemented for the front side and the back side simultaneously, using one of the doping methods indicated above. The penetration depth or the diffusion length of fourth layer 6 on the lower side is selected so that it is small compared to the thickness of second sublayer 1 at the chip edge. The surface concentrations of dopants of third and fourth layers 6, 7 are selected, according to the present invention, in particular to be greater than the associated surface concentrations of dopants of first layer 2 and of first sublayer 3.

Of course, it is possible according to the present invention to combine the second and third exemplary embodiments, that is, both to partially take away the surface dose on the back side by sawing as in FIG. 4, and in each case to provide a thin, highly doped third and fourth layer 6, 7 on the front side and back side of the chip, as in FIG. 5.

According to the present invention, it is also possible to remove the damage zone. This may be done, for example, by etching, particularly using wet chemicals, or by gas etching.

What is claimed is:

1. A semi-conductor system with a p-n junction diode formed as a chip having an edge area, the system comprising:
    a first layer of a first conductivity type, wherein an outer edge of the first layer defines an outer edge of the edge area of the diode; and
    a second layer of a second conductivity type that is contrary to the first conductivity type, wherein the second layer is juxtaposed with the first layer, wherein:
    the second layer includes at least a first sublayer and a second sublayer, the first sublayer includes a first dopant concentration, the second sublayer includes a second dopant concentration, the second dopant concentration is less than the first dopant concentration, the first sublayer and the second sublayer form a p-n junction with the first layer, the p-n junction of the first layer with the first sublayer is provided exclusively in an interior of the diode, the p-n junction between the first layer and the second sublayer is provided in the edge area of the diode, and for each cross-section of the chip taken along a plane extending parallel to a planar surface of the chip, the first sublayer is diffused in as a patterned sublayer doped with the second conductivity type, wherein the first conductivity type is p and the second conductivity type is n, and the first sublayer lies only in the inner part of each of the cross-section, whereby a p-n junction between the first sublayer having the higher first dopant concentration of n conductivity type and the first layer of the p conductivity type lies only in the inner part of the chip, and wherein the first sublayer includes a pedestal portion.

2. The semi-conductor system of claim 1, wherein:
    a dopant for the first sublayer is disposed therein in a patterned fashion.

3. The semi-conductor system of claim 1, wherein:
    the pedestal is produced by trenches.

4. The semi-conductor system of claim 3, wherein:
    the trenches are generated using one of: a diamond saw and a water-supported laser cutter.

5. A semi-conductor system with a p-n junction diode formed as a chip having an edge area, the system comprising:
    a first layer of a first conductivity type, wherein an outer edge of the first layer defines an outer edge of the edge area of the diode;
    a second layer of a second conductivity type that is contrary to the first conductivity type, wherein the second layer is juxtaposed with the first layer, wherein:
    the second layer includes at least a first sublayer and a second sublayer, the first sublayer includes a first dopant concentration, the second sublayer includes a second dopant concentration, the second dopant concentration is less than the first dopant concentration, the first sublayer and the second sublayer form a p-n junction with the first layer, the p-n junction of the first layer with the first sublayer is provided exclusively in an interior of the diode, the p-n junction between the first layer and the second sublayer is provided in the edge area of the diode, and for each cross-section of the chip taken along a plane extending parallel to a planar surface of the chip, the first sublayer is diffused in as a patterned sublayer doped with the second conductivity type, wherein the first conductivity type is p and the second conductivity type is n, and the first sublayer lies only in the inner part of each of the cross-section, whereby a p-n junction between the first sublayer having the higher first dopant concentration of n conductivity type and the first layer of the p conductivity type lies only in the inner part of the chip;
    a third layer; and
    a fourth layer, a dopant concentration of the third layer and a dopant concentration of the fourth layer exceeding those of the first layer, the first sublayer, and the second sublayer.

* * * * *